(12) United States Patent
Dickey et al.

(10) Patent No.: US 8,463,223 B2
(45) Date of Patent: Jun. 11, 2013

(54) RADIO FREQUENCY (RF) RECEIVER WITH DYNAMIC FREQUENCY PLANNING AND METHOD THEREFOR

(75) Inventors: Terry Dickey, Pflugerville, TX (US); Gerald Champagne, Buda, TX (US); Brian Mirkin, Austin, TX (US)

(73) Assignee: Silicon Laboratories Inc, Austin, TX (US)

( * ) Notice: Subject to any disclaimer, the term of this patent is extended or adjusted under 35 U.S.C. 154(b) by 0 days.

(21) Appl. No.: 13/524,909

(22) Filed: Jun. 15, 2012

(65) Prior Publication Data
US 2012/0250809 A1    Oct. 4, 2012

Related U.S. Application Data

(62) Division of application No. 12/641,623, filed on Dec. 18, 2009, now Pat. No. 8,224,279.

(51) Int. Cl.
*H04B 1/00* (2006.01)

(52) U.S. Cl.
USPC ....... 455/296; 455/63.1; 455/114.2; 455/130; 455/207; 375/346

(58) Field of Classification Search
USPC ............ 455/501, 63.1, 114.2, 130, 76, 190.1, 455/207, 260, 296, 278.1, 323; 375/346
See application file for complete search history.

(56) References Cited

U.S. PATENT DOCUMENTS

| | | | |
|---|---|---|---|
| 5,640,697 A | 6/1997 | Orndorff | |
| 5,886,752 A | 3/1999 | Cross | |
| 6,397,048 B1 | 5/2002 | Toda | |
| 6,708,044 B1 | 3/2004 | Puknat | |
| 6,744,828 B1 | 6/2004 | Uchiyama | |
| 7,003,274 B1 | 2/2006 | Olip | |
| 7,038,509 B1 | 5/2006 | Zhang | |
| 7,515,078 B2 | 4/2009 | May | |
| 7,580,691 B1 | 8/2009 | Reed | |
| 7,620,095 B2 | 11/2009 | Ben-Bassat | |
| 7,675,996 B2 | 3/2010 | Johnson et al. | |
| 7,715,814 B2 | 5/2010 | Manku et al. | |

(Continued)

OTHER PUBLICATIONS

Weiss, S. Merrill et al., "New Measurements and Predictions of UHF Television Receiver Local Oscillator Radiation Interference", Sep. 28, 2003, downloaded from URL http://www.h-e.com/pdfs/rw_bts03.pdf.

(Continued)

*Primary Examiner* — Tuan Pham
(74) *Attorney, Agent, or Firm* — Polansky & Associates, P.L.L.C.; Paul K. Polansky

(57) ABSTRACT

A radio frequency (RF) receiver comprises an analog receiver, a digital processor, a clock synthesizer, and a microcontroller. The analog receiver has an input for receiving an RF input signal, and an output for providing a digital intermediate frequency (IF) signal. The digital signal processor has a first input for receiving the digital IF signal, a second input for receiving a clock signal, and a signal output for providing an IF output signal. The clock synthesizer has an input for receiving a clock control signal, and an output for providing the clock signal. The a microcontroller has an input for receiving a channel selection signal, wherein the microcontroller provides the clock control signal to control a frequency of the clock signal dynamically in response to a channel selection input to reduce interference of sub-harmonics created by the clock signal on the analog receiver.

17 Claims, 6 Drawing Sheets

U.S. PATENT DOCUMENTS

| | | |
|---|---|---|
| 7,786,772 B2 | 8/2010 | Gabato et al. |
| 8,145,171 B2 | 3/2012 | Lin et al. |
| 2003/0119461 A1 | 6/2003 | Hirano |
| 2004/0207476 A1 | 10/2004 | Itaya |
| 2004/0250284 A1 | 12/2004 | Dong et al. |
| 2005/0059377 A1 | 3/2005 | Schucker et al. |
| 2005/0255881 A1 | 11/2005 | Yamamoto et al. |
| 2005/0266818 A1 | 12/2005 | Johnson et al. |
| 2006/0068708 A1 | 3/2006 | Dessert et al. |
| 2007/0165747 A1 | 7/2007 | May et al. |
| 2008/0081586 A1* | 4/2008 | Sreerama et al. ............ 455/255 |
| 2008/0192876 A1 | 8/2008 | Dulger |
| 2009/0154615 A1* | 6/2009 | Hijikata et al. ............... 375/344 |
| 2009/0245440 A1 | 10/2009 | Vancorenland et al. |
| 2010/0103004 A1* | 4/2010 | Dunne et al. .................. 341/118 |
| 2011/0098014 A1 | 4/2011 | Martens et al. |
| 2011/0134986 A1 | 6/2011 | Skull et al. |

OTHER PUBLICATIONS

Actions on the Merits for parent U.S. Appl. No. 12/641,623, filed Dec. 18, 2009, and Actions on the Merits for U.S. Appl. No. 12/641,540, filed Dec. 18, 2009.

Actions on the Merits for parent U.S. Appl. No. 12/641,623, filed Dec. 18, 2009, now issued Patent 8,224,279, issued Jul. 17, 2012, and Actions on the Merits for U.S. Appl. No. 12/641,540, filed Dec. 18, 2009.

* cited by examiner

RADIO FREQUENCY (RF) RECEIVER WITH DYNAMIC FREQUENCY PLANNING AND METHOD THEREFOR

This application is a division of U.S. application Ser. No. 12/641,623, entitled "Radio Frequency (RF) Receiver with Dynamic Frequency Planning and Method Therefor," invented by Terry Dickey, Gerald Champagne, and Brian Mirkin, filed Dec. 18, 2009 and assigned to the assignee hereof, which is herein incorporated by reference in its entirety.

CROSS REFERENCE TO RELATED, COPENDING APPLICATION

Related subject matter is found in a copending patent application, application Ser. No. 12/641,540, entitled "Radio Frequency GM Receiver with Frequency Planning and Method Therefor," invented by Sherry X. Wu, Mustafa H. Koroglu, Alessandro Piovaccari, and Ramin K. Poorfard, filed Dec. 18, 2009 and assigned to the assignee hereof.

FIELD OF THE DISCLOSURE

The present disclosure relates generally to a radio frequency (RF) receivers, and more particularly to RF receivers subject to magnetic coupling of signals between circuits.

BACKGROUND

Radio frequency RF) receivers are used in a wide variety of applications such as television receivers, cellular telephones, pagers, global positioning system (UPS) receivers, cable moderns, cordless phones, satellite radio receivers, and the like. As used herein, a "radio frequency" signal means an electrical signal conveying useful information and having a frequency from about 3 kilohertz (kHz) to hundreds of gigahertz (GHz), regardless of the medium through which such signal is conveyed. Thus an RF signal may be transmitted through air, free space, coaxial cable, fiber optic cable, etc. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted down to baseband for further processing. Thus a superheterodyne receiver requires two mixing steps.

Modern integrated circuit technology has allowed many of the circuits used in RF receivers to be combined on-chip and thus to substantially reduce the cost of the RF receiver. However this level of integration creates other problems. For example, signals from one part of the chip may be electrically or magnetically coupled to circuits in another part of the chip. These unwanted signal couplings can distort the desired signal and create artifacts that can be perceived by the viewer or listener. Traditionally, integrated circuit designers have used layout strategies to reduce coupling between circuits, such as physical separation, the addition of ground rings, a reduction in the length of conductors, etc. However these techniques, while still useful, are unable to completely eliminate the deleterious effects of electrically or magnetically coupled energy.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
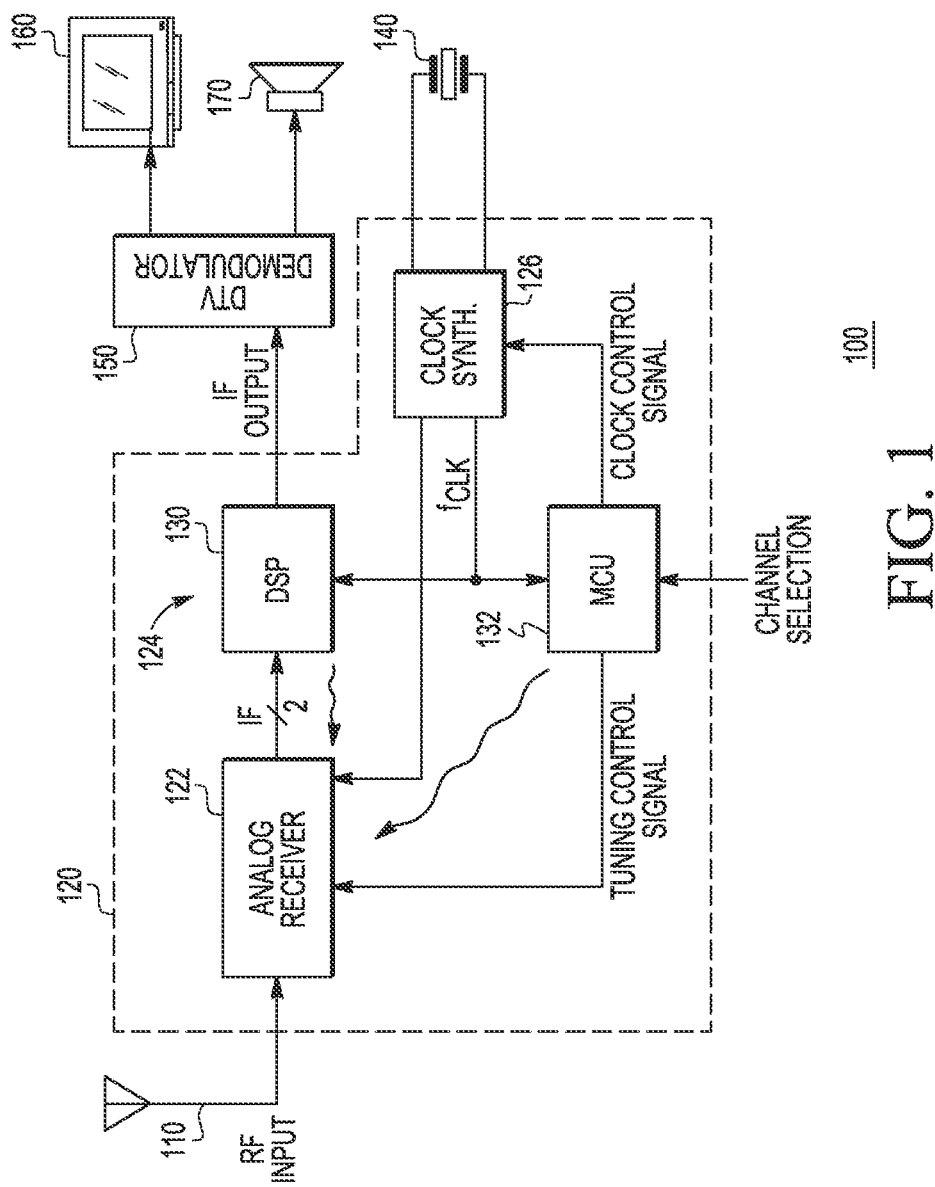
FIG. 1 illustrates in partial block diagram and partial schematic form a radio frequency (RF) receiver according to an embodiment of the present invention.

FIG. 1 illustrates in partial block diagram and partial schematic form a radio frequency (RF) receiver 100 according to an embodiment of the present invention. RF receiver 100 is a multi-standard television receiver capable of receiving both terrestrial and cable television signals, Receiver 100 includes generally a signal source such as an antenna 110, a television (TV) tuner chip 120, a crystal 140, a digital television (DTV) demodulator 150, a display device 160, and a loudspeaker 170, Antenna 110 is capable of receiving broadcast television signals and providing an RF input signal labeled "RF INPUT" (through a transformer, not shown in FIG. 1) to TV tuner chip 120. TV tuner chip 120 receives and filters a selected channel in the RF INPUT signal indicated by an input labeled "CHANNEL SELECTION", and converts it to an intermediate frequency (IF) digital output signal labeled "IF OUTPUT". DTV demodulator 150 receives and demodulates the IF OUTPUT signal and separates the selected channel's spectrum into video and audio signals that it provides to display device 160 and loudspeaker 170, respectively.

TV tuner chip 120 includes an analog receiver 122, a digital processor 124, and a clock synthesizer 126, Analog receiver 122 has an input coupled to antenna 110 through a balanced-unbalanced (balun) transformer, not shown in FIG. 1, a control input for receiving a signal labeled "TUNING CONTROL SIGNAL", a clock input, and an output for providing a digital intermediate frequency (IF) signal labeled "IF". The IF signal includes both an in-phase (I) component and a quadrature (Q) component.

Digital processor 124 includes a digital signal processor (DSP) 130 and a microcontroller (MCU) 132. DSP 130 has a signal input for receiving the IF signal, a clock input for receiving a clock signal labeled "$f_{CLK}$", and an output for providing signal IF OUTPUT, MCU 132 has an input for receiving the CHANNEL SELECTION input, a clock input for receiving $f_{CLK}$, a first output for providing the TUNING CONTROL SIGNAL, and a second output for providing a signal labeled "CLOCK CONTROL SIGNAL".

Clock synthesizer 126 has two terminals connected to crystal 140, a control input for receiving the CLOCK CONTROL SIGNAL from MCU 132, a first output connected to the clock input of analog receiver 122, and a second output for providing signal $f_{CLK}$.

Generally, TV tuner chip 120 operates to tune a selected television channel and output the channel to digital demodulator 150. Analog receiver 122 tunes the selected channel by mixing it with a local oscillator signal whose frequency is chosen to mix the selected channel to a desired IF. In TV tuner chip 120, the desired IF is a low IF of 4 MHz, but in TV tuner chip 120 the IF may also be chosen as a zero IF. Analog receiver 122 further processes the analog IF signal and converts it to digital form using analog-to-digital converters (ADCs), not shown, fix further processing in the digital domain by DSP 130. In addition to supporting DIV receivers as illustrated, TV tuner chip 120 also supports analog television (ATV) receivers and integrates an ATV demodulator, not shown in FIG. 1, for that purpose.

MCU 132 performs frequency planning under the control of firmware. It converts the CHANNEL SELECTION input into an appropriate CLOCK CONTROL SIGNAL to clock synthesizer 126. MCU 132 includes a memory, such as a read-only memory (ROM) or FLASH memory, for storage of the firmware that controls the frequency planning algorithm, as well as a serial input/output port for receiving the CHANNEL SELECTION input.

Because it integrates circuitry operating at different frequencies, TV tuner chip 120 is susceptible to the harmful effects of undesired signal coupling, known as spurs. A spur is any unwanted tonal energy generated by the device itself. A spur can harm the signal in the wanted channel either by acting as a co-channel, or if it corrupts the VCO, it can reciprocally mix with large blockers and hence hurt the wanted channel. However TV tuner chip 120 performs frequency planning for $f_{CLK}$ to take into account the effects of three main spur coupling mechanisms. First, it takes into account the direct coupling of $f_{CLK}$ and its harmonics to other circuits. Digital processor 124 operates in synchronization with $f_{CLK}$. As is conventional, $f_{CLK}$ is a square wave signal that has significant energy at its nominal frequency as well as certain harmonic frequencies. If these signals are coupled to circuits that tune or process the RF INPUT signal, undesired energy could be coupled into the passband of analog processor 122, distorting the signal.

Second, $f_{CLK}$ can mix with a signal generated in clock synthesizer 126 to create a spur. The spur is harmful when its frequency overlaps with the frequency of the desired channel.

Another spur mechanism is the generation and coupling of sub-harmonics. A sub-harmonic is a signal with energy that is generated at a fraction of a given frequency such as $f_{CLK}$ and at harmonics of this fraction. In TV tuner chip 120, digital processor 124 operates in synchronism with the $f_{CLK}$ signal. Certain events, such as the switching of internal buses, occur at intervals equal to an integer number of $f_{CLK}$ periods. These switching events create energy that appears at frequencies tower than $f_{CLK}$. What makes this mechanism particularly insidious is that it is difficult to identify the primary sub-harmonic by using computer simulation alone, but may require observation on the chip itself after the design is complete. For example in designing TV tuner chip 120, the inventors estimated from computer simulation that digital processor 124 would generate a primary sub-harmonic at $f_{CLK}/8$ (and other sub-harmonics at harmonics of $f_{CLK}/8$). However when observing the manufactured chip, they discovered the primary sub-harmonic to actually occur at $f_{CLK}/16$.

By using frequency planning, TV tuner chip 120 is able to change its frequency to any suitable frequency in the range of clock synthesizer 126. In order to support frequency planning, TV tuner chip 120 includes a clock synthesizer, clock synthesizer 126, that is capable of changing its operating frequency from a nominal operating frequency to frequencies within an available frequency range in small, discrete steps. In this way MCU 132, under the control of firmware stored in its internal program memory, is able to change $f_{CLK}$ to a frequency that reduces undesired coupling.

Figure 2:
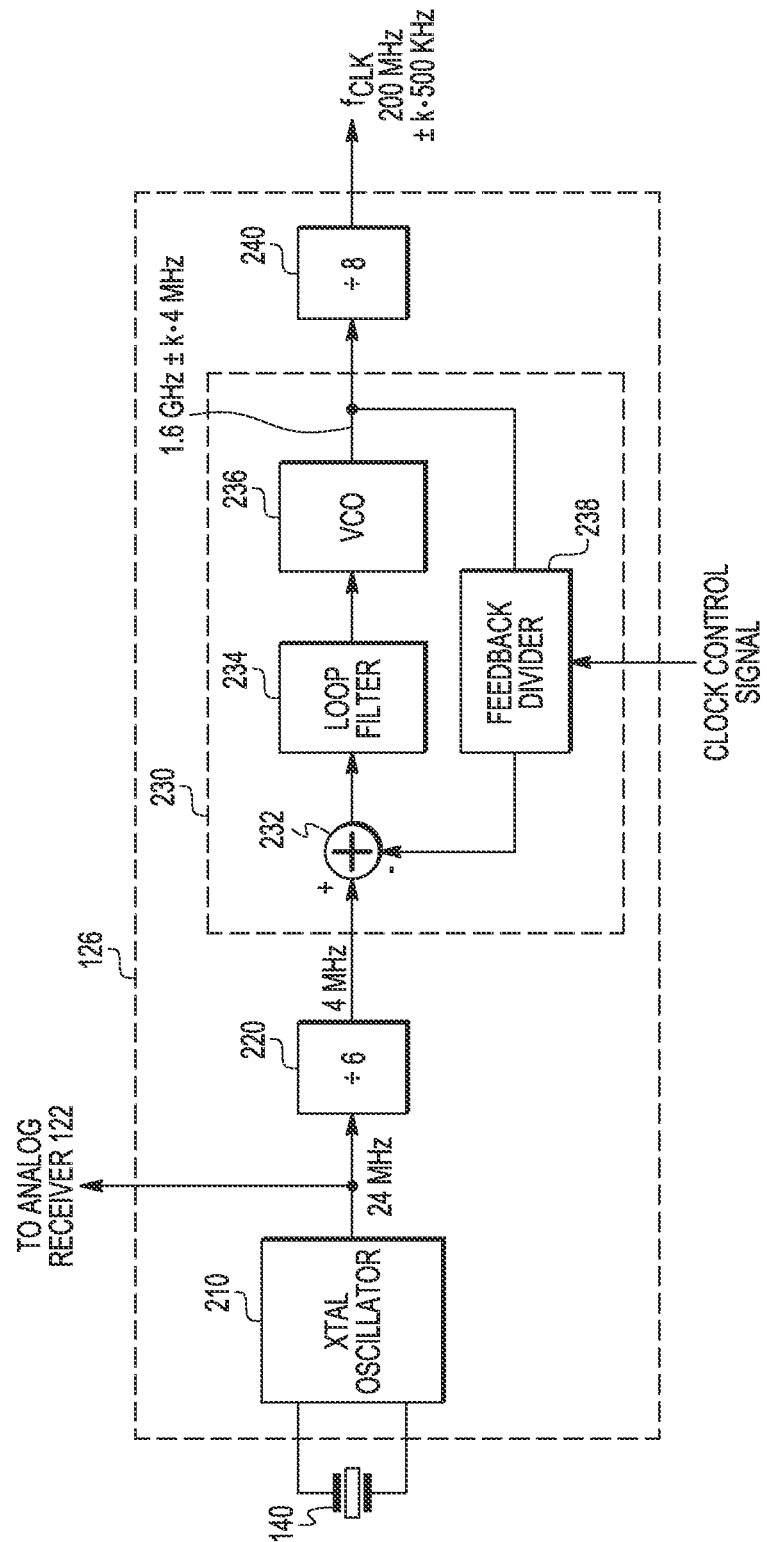
FIG. 2 illustrates in partial block diagram and partial schematic faun a portion of the RF receiver of FIG. 1 showing details of the clock synthesizer.

The techniques by which MCU 132 performs frequency planning for $f_{CLK}$ will now be described with reference to FIGS. 2-8. FIG. 2 illustrates in partial block diagram and partial schematic form a portion 200 of TV tuner chip 120 of FIG. 1 showing details of clock synthesizer 126. Portion 200 includes crystal 140 and clock synthesizer 126, which includes generally a crystal oscillator circuit 210, a divider 220, a phase locked loop (PLL) 230, and a divider 240.

Crystal oscillator circuit 210 includes two terminals connected to respective terminals of crystal 140. Crystal oscillator circuit 210 inverts the signal between the terminals of crystal 140 to create oscillation and to provide a clock output signal to analog receiver 122. In the illustrated embodiment, crystal 140 is a low-cost crystal having a standard frequency of 24 megahertz (MHz). Note that analog receiver 122 additionally multiplies the 24 MHz clock signal according to the TUNING CONTROL SIGNAL to form a local oscillator signal to mix the selected channel to the desired IF.

Divider 220 has an input connected to the output of crystal oscillator circuit 210, and an output. In the illustrated embodiment, divider 220 divides the 24 MHz output signal by six to produce a 4 MHz signal.

PLL 230 converts the 4 MHz signal to a multiplied signal. PLL 230 is a digital PLL, that includes a phase detector 232, a loop filter 234, a voltage controlled oscillator (VCO) 236, and a feedback divider 238. Phase detector 232 has a positive input connected to the output of divider 220, a negative input, and an output. Loop filter 234 has an input connected to the output of phase detector 232, and an output. VCO 236 has an input connected to the output of loop filter 234, and an output for providing a multiplied signal. Feedback divider 238 has an input connected to the output of VCO 236, a control input for receiving the CLOCK CONTROL SIGNAL, and an output connected to the negative input of phase detector 232. Feedback divider 238 changes the divide ratio of the VCO output signal according to the CLOCK CONTROL SIGNAL and in conjunction with phase detector 232 allows VCO 235 to provide the multiplied signal in 4 MHz frequency steps.

In the illustrated embodiment, the output of PLL 230 is a signal with a nominal frequency of 1.6 gigahertz (GHz) but which may be varied in increments of 4 MHz. Divider 240 is a fixed divider that divides the input thereof by eight. As illustrated, it divides the 1.6 GHz±k*4 MHz signal to a 200 MHz±k*500 kHz clock signal, in which the nominal frequency of $f_{CLK}$ is 200 MHz. Note that if $f_{CLK}$ is increased too much, then the circuitry of TV tuner chip 120 may not operate properly. If it is decreased too much, then DSP 130 and MCU 132 may not have enough bandwidth to perform the necessary processing tasks. Given these considerations, the firmware in MCU 132 allows the operating frequency of $f_{CLK}$ to range between 190 MHz and 207 MHz in 1 MHz increments. In other embodiments, the range and granularity of $f_{CLK}$ may each be either increased or decreased.

Thus clock synthesizer 126 is able to alter its output frequency in suitably fine increments over a range to move $f_{CLK}$ to a frequency that reduces harmful coupling and spur generation. It also does so using a low-cost standard 24 MHz crystal.

Figure 3:
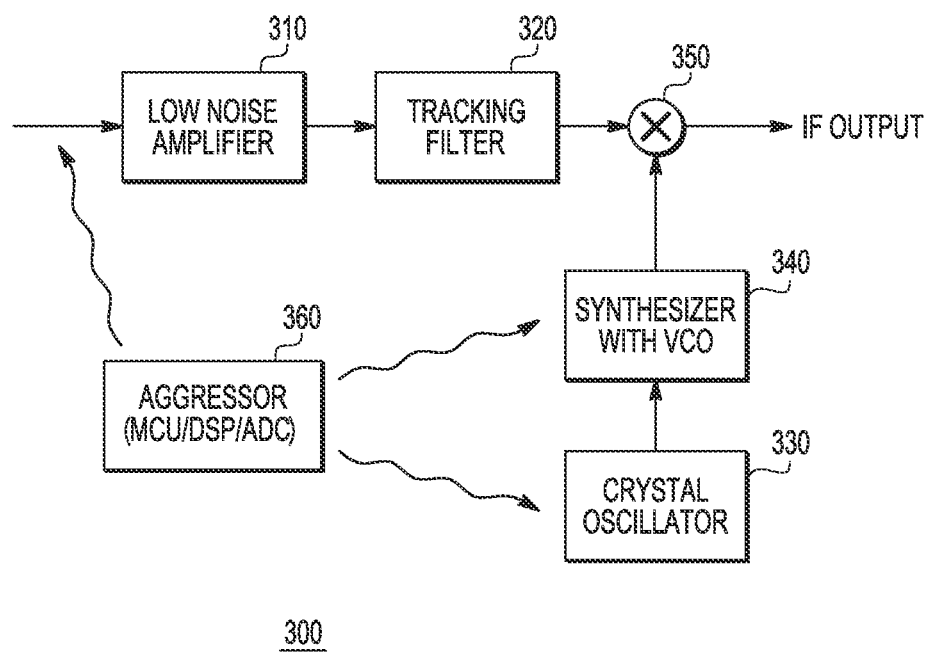
FIG. 3 illustrates in block diagram form a portion of the TV tuner chip of FIG. 1 showing the coupling of RF energy from an aggressor circuit to other circuits.

The sources of undesired signal coupling will now be described with reference to FIG. 3, which illustrates in block diagram form a portion 300 of TV tuner chip 120 of FIG. 1 showing the coupling of RF energy from an aggressor circuit to other circuits. Portion 300 includes a low noise amplifier 310, a tracking filter 320, a crystal oscillator 330, a synthesizer with VCO 340, a mixer 350, and an aggressor circuit 360. Crystal oscillator 330 corresponds to both crystal 140 and crystal oscillator circuit 210 as shown in FIG. 2. Low noise amplifier 310, tracking filter 320, and mixer 330 correspond to analog receiver 122 of FIG. 1. Aggressor circuit 360 includes DSP 130, MCU 132, and/or the ADCs of analog processor 122.

Aggressor circuit 360 transfers energy through magnetic flux created by internal inductances, such as bond wires to external terminals. Inductances in the magnetically coupled circuits convert the magnetic flux into unwanted electrical signals. As shown in FIG. 3, aggressor circuit 360 couples signal energy, by magnetic coupling, primarily to three points in TV tuner chip 120. First, aggressor 360 couples energy to the input of low noise amplifier 310. When this signal has energy within the passband of tracking filter 320, it is mixed with the desired TV channel and forms part of IF output.

Second, aggressor circuit 360 couples energy into the LO signal of synthesizer with VCO 340. This interfering energy creates spurs when mixed with signals in the VCO, which distorts the local oscillator signal and thus distorts IF OUTPUT.

Third, aggressor circuit 360 couples energy into crystal oscillator 330, which it mixes with internal frequencies to generate spurs.

Figure 4:
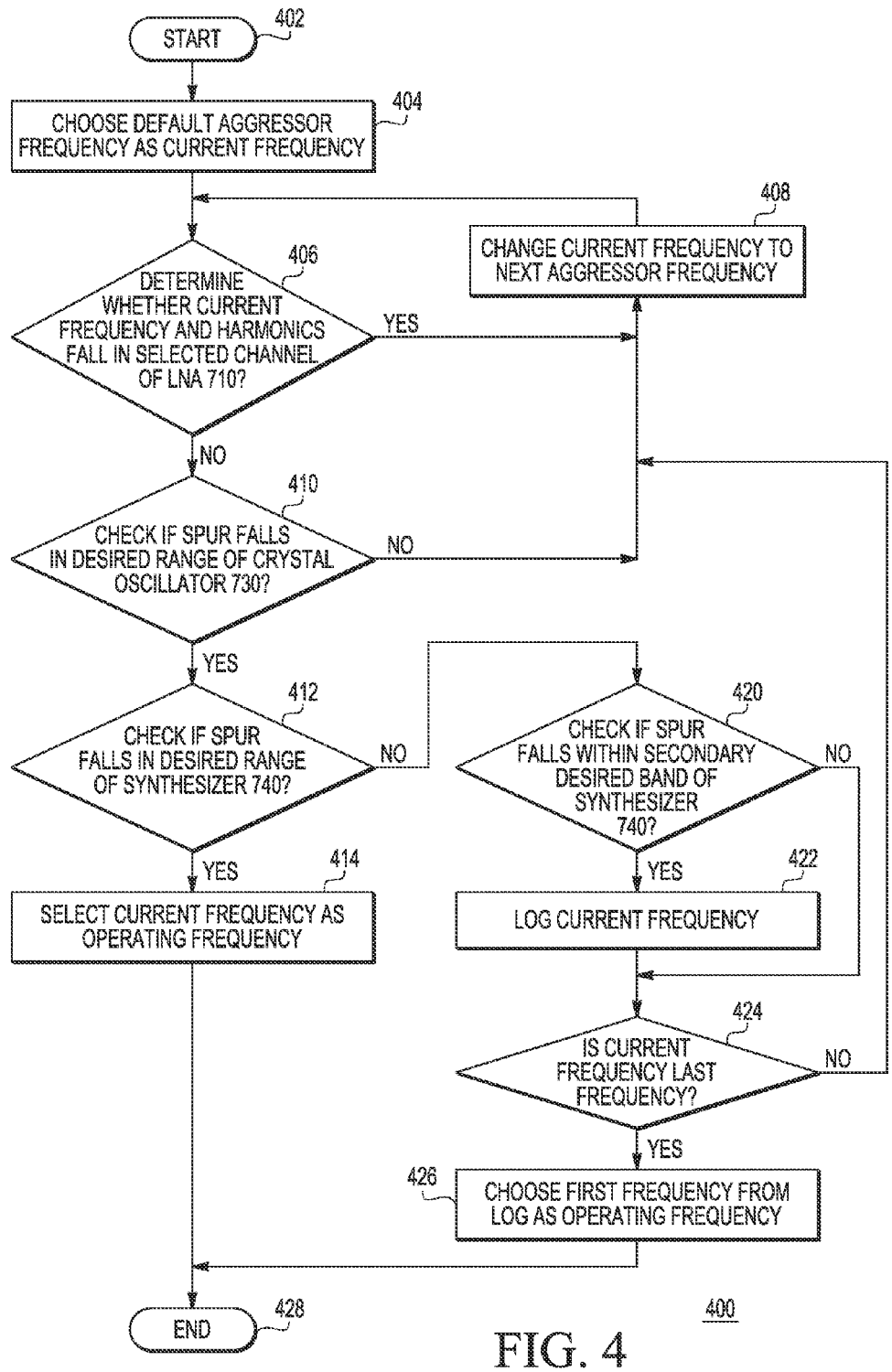
FIG. 4 illustrates a flow diagram of a frequency planning algorithm used by the TV tuner chip of FIG. 1.

FIG. 4 illustrates a flow diagram of a frequency planning algorithm 400 used by TV tuner chip 120 of FIG. 1. Frequency planning algorithm starts at step 402. At step 404, algorithm 400 chooses a default aggressor frequency as the current frequency. At step 406, the algorithm determines, for this current frequency, whether it and its harmonics fall within a selected channel of LNA 310. It is especially important to avoid this frequency since this energy will be passed by tracking filter 320. Therefore if any harmonic of the current frequency falls within the selected channel, the current frequency is changed to the next aggressor frequency at step 408.

If no frequency or harmonic falls within the passband, i.e. the frequency and all harmonics fall outside the passband, then the algorithm checks, at step 410, whether a spur auk within a desired range of crystal oscillator 330. The desired range is a range that doesn't produce any significant harmful spurs. If the spur does not fall in the desired range, then the flow returns to step 408 for the selection of a new $f_{CLK}$ frequency. If the spur does fall in the desired range, then the flow continues to step 412.

Step 412 determines whether the spur falls within the desired range of synthesizer 340. If so, then at step 414 the algorithm selects the current frequency as the operating frequency, and then frequency planning algorithm 400 ends at step 428.

If not, then algorithm 400 determines whether secondary criteria are met by checking, at step 420, whether the spur falls within a secondary desired band of synthesizer 340. As used herein, the secondary desired band is first a "taboo" channel (frequency band that is not allocated to any channel), or second, a channel in which a blocker channel is not the strongest, such as channels excluding the current channel ±6 channels or ±12 channels. If the spur falls within the secondary desired band, then algorithm 400 logs the frequency at step 422. If the frequency is the last frequency then algorithm 400 chooses, at step 426, the first frequency from the log as the operating frequency, and then ends at step 428. If not, then flow returns to step 408.

By performing the frequency planning associated with flow chart 400, TV tuner chip 120 is able to significantly reduce direct coupling and harmful spur generation. The frequency planning firmware in TV tuner chip 120 also has a mechanism to prevent the harmful effects of sub-harmonics, as will now be described with reference to FIGS. 5-8.

Figure 5:
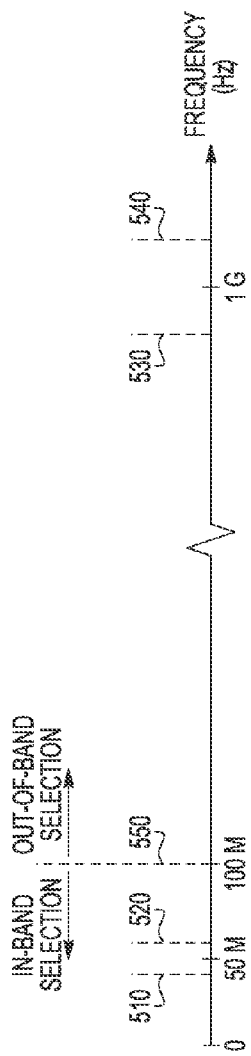
FIG. 5 illustrates a graph of a tuning range of the TV tuner chip of FIG. 1.

FIG. 5 illustrates a graph 500 of a tuning range of TV tuner chip 120 of FIG. 1. In FIG. 5, the horizontal axis represents frequency in Hz. Generally, TV tuner chip 120 supports various worldwide television standards having channels between about 44 MHz and about 1 gigahertz (GHz). The actual channel placement and width varies according to the particular standard selected.

As described above, digital processor 124 produces a primary sub-harmonic at 200 MHz/16, or 12.5 MHz, when $f_{CLK}$ is set to its nominal frequency of 200 MHz, and additional sub-harmonics at $M \cdot f_{CLK}/16$. When a relatively low frequency channel spans a frequency of 50 MHz, 62.5 MHz, 75 MHz, or 87.5 MHz, the nominal value of $f_{CLK}$ creates a sub-harmonic in-band for N=4, 5, 6, and 7.

However TV tuner chip 120 allows $f_{CLK}$ to vary within a range of 190 MHz to 207 MHz around its nominal frequency. Thus FIG. 5 illustrates a sub-harmonic 510 at 47.5 MHz (for $f_{CLK}$=190 MHz) and a sub-harmonic 520 at 51.75 MHz (for $f_{CLK}$=207 MHz). Thus for channels having certain center frequencies and a width that is 6 MHz wide (or for some supported standards, 8 MHz wide), it is not possible within the supported range of clock synthesizer 126 to select a value of $f_{CLK}$ to avoid placing a sub-harmonic in-band.

However there exists a critical frequency 550, which is about 100 MHz for TV tuner chip 120, at which the separation of the sub-harmonics is great enough for all sub-harmonics to be out of band for at least one available value of $f_{CLK}$. Near the high end of the tuning range, TV tuner chip 120 generates a first sub-harmonic 630 for $f_{CLK}$=190 MHz that is separated from a second sub-harmonic 540 for $f_{CLK}$=207 MHz by a significant amount.

Accordingly, when the CHANNEL SELECTION signal indicates a channel that ties above critical frequency 650, TV tuner chip 120 attempts to select a value of $f_{CLK}$ to move all sub-harmonics out-of-band. When the CHANNEL SELECTION signal indicates a channel that lies below critical frequency 550, TV tuner chip 120 selects a value of $f_{CLK}$ that produces a sub-harmonic that is in-band but at a frequency that is tolerable.

Figure 6:
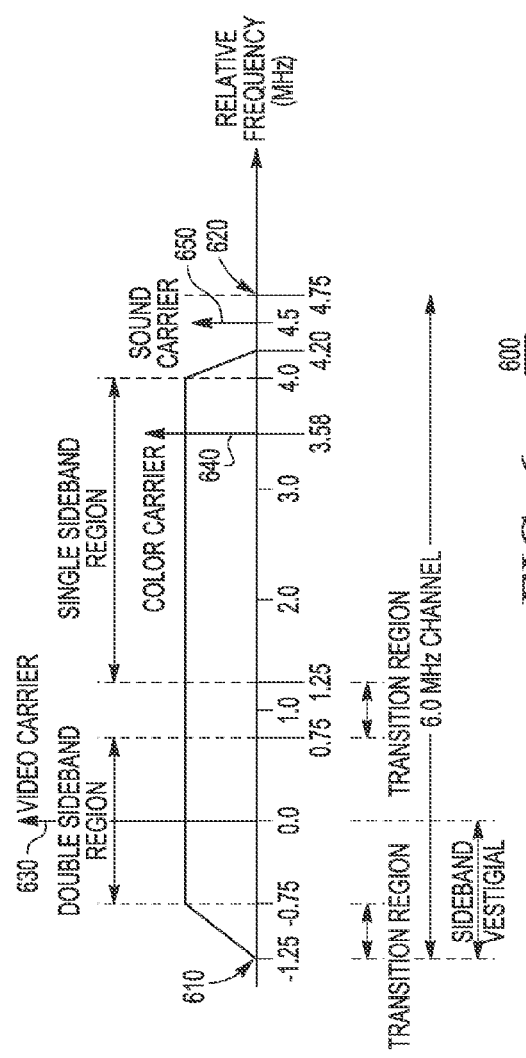
FIG. 6 illustrates a graph of a spectrum of a North American analog broadcast television (NTSC) channel.

FIG. 6 illustrates a graph of a spectrum 600 of a North American analog broadcast television (NTSC) channel. The graph includes a horizontal axis showing relative frequency in MHz of a single NTSC channel. Thus the channel may be at baseband, an IF, or RF. In the NBC system, channels are 6.0 MHz wide. Spectrum 600 includes a lower band edge 610 and an upper band edge 620 that is 6.0 MHz higher in frequency. As is conventional, the origin is considered to be a frequency of the video carrier 630 (also known as the picture carrier), which places lower band edge 510 at −1.25 MHz. A double sideband region is ±0.75 MHz around picture carrier 630. The range of the spectrum below video carrier 630 is considered to be the vestigial sideband, and the range between −1.25 MHz and −0.75 MHz is considered to be a transition region. A further transition region occurs between 0.75 MHz and 1.25 MHz. A color carrier 640 occurs at 3.58 MHz relative to picture carrier 630. A sound carrier 650 occurs at 4.5 MHz relative to picture carrier 630. As can be readily seen, a characteristic of television channels such as NTSC channels is that the information content is not uniform within spectrum 600, but is centered around video carrier 630, color carrier 640, and sound carrier 650.

Figure 7:
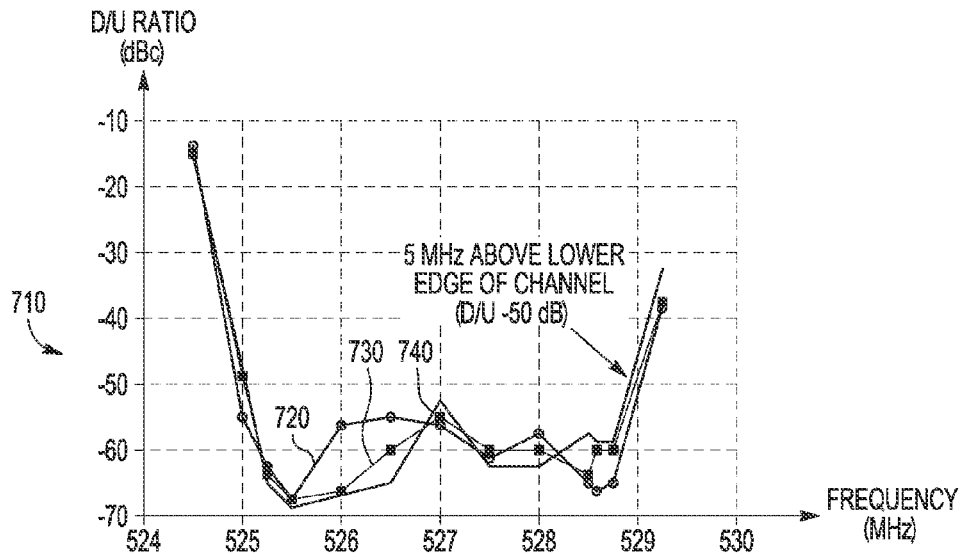
FIG. 7 illustrates a graph of a set of "NV" curves for a television channel.

Moreover the qualitative effect of interfering signals across an NTSC channel is also non-uniform, a fact which has been understood for quite some time. FIG. 7 illustrates a graph 700 of a set of "W" curves 710 for a television channel. Set of "W" curves 710 was measured in 1986 and published by Weiss, S. et al., "New Measurements and Predictions of UHF Television Receiver Local Oscillator Radiation Interference," Sep. 28, 2003, available from URI h-e.com/pdfs/rwbts03.pdf. In FIG. 7, the horizontal axis represents frequency in MHz, and the vertical axis the level of interfering sine wave which experts rank as just perceptible, labeled "D/U RATIO", in decibels with respect to the carrier (dBc). Graph 700 shows NTSC channel 23, transmitted between 524 MHz and 530 MHz. Set of W curves 710 includes a first W curve 720, a second W curve 730, and a third W curve 740, which represent perception thresholds for a gray screen, a still picture of a boat, and a moving picture respectively. While the shape of the curves differ slightly, they all have a similar shape with local minimums around the picture and color carriers. The picture and color carriers are frequencies at which interfering signals become perceptible at comparatively weak levels.

Ideally $f_{CLK}$ could be selected to place all sub-harmonics out of the desired band. However this Objective is not always possible as described with respect to FIG. 5 above. Moreover because the frequency planning performed by TV tuner chip 120 also takes into account clock signal coupling and spur generation and coupling, it may be necessary to set $f_{CLK}$ to a frequency in which a sub-harmonic falls somewhere within the channel. TV tuner chip 120 dynamically alters $f_{CLK}$ according to the CHANNEL SELECTION input to move the sub-harmonic to a least objectionable frequency given other constraints in the system.

Moreover it is possible to predetermine desired $f_{CLK}$ frequencies for each channel and to store these frequencies for later retrieval based on the selected channel. However adding enough storage space to save all these values on-chip is costly for a low-cost multi-standard integrated circuit. For example, there are 158 channels in NTSC alone, and TV tuner chip 120 supports other broadcast standards including PAL and SECAM as well as several variants of NTSC.

Figure 8:
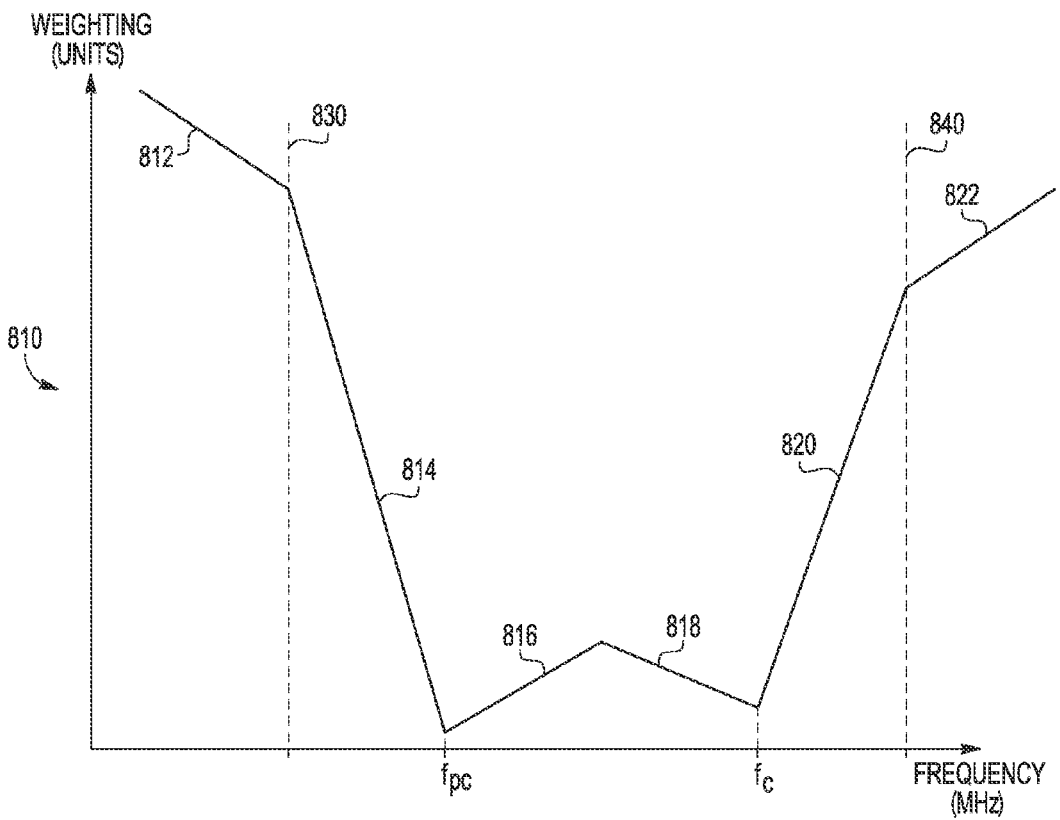
FIG. 8 illustrates a graph of a piecewise linear approximation of the set of "W" curves of FIG. 7.

TV tuner chip 120 solves this problem by dynamically selecting this least objectionable frequency by approximating the characteristics of the "W" curve and using its available processing power to dynamically determine the least objectionable $f_{CLK}$ frequency for a channel that has been selected. FIG. 8 illustrates a graph 800 of a piecewise linear approximation 810 of set of "W" curves 810 of FIG. 4. In FIG. 8, the horizontal axis represents frequency in MHz, and the vertical axis represents weighting in units. Piecewise linear approximation 810 includes a first segment 812 below lower band edge 830; a second segment 814 between lower band edge 830 and the picture carrier, labeled "$f_{PC}$"; a third segment 816 between $f_{pc}$ and an intermediate frequency; a fourth segment 818 between the intermediate frequency and the color carrier, labeled "$f_C$"; a fifth segment 820 between $f_C$ and an upper band edge 840; and a sixth segment 822 above upper band edge 840. By defining piecewise linear approximation 810 and using it to weight the subjective effect of the interfering sub-harmonic on the user, and choosing the $f_{CLK}$ frequency having the sub-harmonic with the greatest weight to be considered the least objectionable frequency, TV tuner chip 120 is able to conserve storage space that would have been needed for a lookup table, and keep its cost low.

In another embodiment, the W curve can be expanded to take into account image frequencies. Since sub-harmonic energy at image frequencies can be mixed into the passband and not cancelled, this undesirable energy can be significant as well. Also other appropriate rules can be used for transmission systems other than NTSC. For example for North American digital television (ATSC) systems, the weighting function ensures that any spurious energy does not land on the pilot frequency, which is about 10 dB more sensitive than other in-band frequencies.

Thus TV tuner chip 120 achieves high integration and low cost by performing dynamic frequency planning. TV tuner chip 120 selects a frequency $f_{CLK}$ at which to operate integrated digital circuitry based on three coupling mechanisms: direct clock signal coupling, spur generation and coupling, and sub-harmonic coupling. TV tuner chip 120 dynamically selects a least objectionable frequency based on the channel selected by the user. In other embodiments, TV tuner chip 120 may implement frequency planning for other coupling mechanisms or for only one or more of the ones described herein in various combinations.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A radio frequency (RF) receiver comprising:
   an analog receiver having an input for receiving an RF input signal, and an output for providing a digital intermediate frequency (IF) signal;
   a digital signal processor having a first input for receiving said digital IF signal, a second input for receiving a clock signal, and a signal output for providing an IF output signal;
   a clock synthesizer having an input for receiving a clock control signal, and an output for providing said clock signal; and
   a microcontroller having an input for receiving a channel selection signal, wherein said microcontroller provides said clock control signal to control a frequency of said clock signal dynamically in response to a channel selection input to reduce interference of sub-harmonics produced by said digital signal processor on said analog receiver.

2. The RF receiver of claim 1 wherein said microcontroller dynamically controls said frequency of said clock signal to reduce interference of a sub-harmonic comprising eight cycles of said clock signal.

3. The RF receiver of claim 1 wherein said microcontroller dynamically controls said frequency of said clock signal to reduce interference of a sub-harmonic comprising sixteen cycles of said clock signal.

4. The RF receiver of claim 1 wherein said analog receiver, said digital signal processor, said clock synthesizer, and said microcontroller are combined on a single integrated circuit.

5. The RF receiver of claim 1, wherein said microcontroller is characterized as operating under control of firmware.

6. A radio frequency (RF) receiver comprising:
   an analog receiver having an input for receiving an RF input signal, and an output for providing a digital intermediate frequency (IF) signal;
   a digital signal processor having a first input for receiving said digital IF signal, a second input for receiving a clock signal, and a signal output for providing an IF output signal;
   a clock synthesizer having an input for receiving a clock control signal, and an output for providing said clock signal; and a circuit having an input for receiving a channel selection signal, wherein said circuit provides said clock control signal to control a frequency of said clock signal dynamically in response to a channel selection input to reduce interference of sub-harmonics produced by said digital signal processor on said analog receiver.

7. The RF receiver of claim 6 wherein said circuit dynamically controls said frequency of said clock signal to reduce interference of a sub-harmonic comprising eight cycles of said clock signal.

8. The RF receiver of claim 6 wherein said circuit dynamically controls said frequency of said clock signal to reduce interference of a sub-harmonic comprising sixteen cycles of said clock signal.

9. The RF receiver of claim 6 wherein said analog receiver, said digital signal processor, said clock synthesizer, and said circuit are combined on a single integrated circuit.

10. The RF receiver of claim 6, wherein:
said clock synthesizer further has a second output for providing a second clock signal; and
said circuit further has a clock input for receiving said second clock signal.

11. The RF receiver of claim 6, wherein said circuit comprises a microcontroller.

12. The RF receiver of claim 11, wherein said microcontroller is characterized as operating under control of firmware.

13. The RF receiver of claim 11, wherein said microcontroller includes a serial input/output port for receiving said channel selection input.

14. A radio frequency (RF) receiver comprising:
an analog receiver having an input for receiving an RF input signal, and an output for providing a digital intermediate frequency (IF) signal;
a digital signal processor having a first input for receiving said digital IF signal, a second input for receiving a clock signal, and a signal output for providing an IF output signal;
a clock synthesizer having an input for receiving a clock control signal, and an output for providing said clock signal; and
means for providing said clock control signal to control a frequency of said clock signal dynamically in response to a channel selection input to reduce interference of sub-harmonics produced by said digital signal processor on said analog receiver.

15. The RF receiver of claim 14 wherein said means for providing dynamically controls said frequency of said clock signal to reduce interference of a sub-harmonic comprising eight cycles of said clock signal.

16. The RF receiver of claim 14 wherein said means for providing dynamically controls said frequency of said clock signal to reduce interference of a sub-harmonic comprising sixteen cycles of said clock signal.

17. The RF receiver of claim 14 wherein said analog receiver, said digital signal processor, said clock synthesizer, and said means for providing are combined on a single integrated circuit.

* * * * *

UNITED STATES PATENT AND TRADEMARK OFFICE
CERTIFICATE OF CORRECTION

PATENT NO. : 8,463,223 B2
APPLICATION NO. : 13/524909
DATED : June 11, 2013
INVENTOR(S) : Terry Dickey et al.

It is certified that error appears in the above-identified patent and that said Letters Patent is hereby corrected as shown below:

On the Title page, Item [74] in the Attorney, Agent, or Firm field, replace "Paul K. Polansky" with "Paul J. Polansky".

In the Specification

In column 1, line 18, replace "GM" with "(RF)".

In column 1, line 31, replace "RF)" with "(RF)".

In column 1, line 33, replace "(UPS)" with "(GPS)".

In column 1, line 34, replace "moderns," with "modems,".

In column 2, line 5, replace "faun" with "form".

In column 2, line 16, replace "NV" with "W".

In column 2, line 29, replace "signals," with "signals.".

In column 2, line 33, replace "170," with "170.".

In column 2, line 45, replace "126," with "126.".

In column 2, line 57, replace "OUTPUT," with "OUTPUT.".

In column 3, line 10, replace "fix" with "for".

In column 3, line 11, replace "DIV" with "DTV".

In column 3, line 52, replace "tower" with "lower".

In column 5, line 40, replace "auk" with "falls".

Signed and Sealed this
Thirteenth Day of August, 2013

Teresa Stanek Rea
*Acting Director of the United States Patent and Trademark Office*

CERTIFICATE OF CORRECTION (continued)
U.S. Pat. No. 8,463,223 B2

In column 6, line 14, replace "M" with "N".

In column 6, line 36, replace "ties" with "lies".

In column 6, line 47, replace "NBC" with "NTSC".

In column 7, line 5, replace "URI" with "URL".

In column 7, line 5, replace "h-e.com/pdfs/rwbts03.pdf." with "h-e.com/pdfs/rw_bts03.pdf.".

In column 7, line 20, replace "Objective" with "objective".

In column 7, line 61, replace "in" with "In".